(12) United States Patent
Wang et al.

(10) Patent No.: US 11,264,384 B2
(45) Date of Patent: Mar. 1, 2022

(54) CMOS STRUCTURE AND METHOD FOR MANUFACTURING CMOS STRUCTURE

(71) Applicant: BOE TECHNOLOGY GROUP CO., LTD., Beijing (CN)

(72) Inventors: Zhi Wang, Beijing (CN); Feng Guan, Beijing (CN); Guangcai Yuan, Beijing (CN); Chen Xu, Beijing (CN); Lei Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/642,723

(22) PCT Filed: Mar. 4, 2019

(86) PCT No.: PCT/CN2019/076871
§ 371 (c)(1),
(2) Date: Feb. 27, 2020

(87) PCT Pub. No.: WO2020/177057
PCT Pub. Date: Sep. 10, 2020

(65) Prior Publication Data
US 2021/0151435 A1    May 20, 2021

(51) Int. Cl.
*H01L 27/092*    (2006.01)
*H01L 21/8238*    (2006.01)
(Continued)

(52) U.S. Cl.
CPC .. *H01L 27/0922* (2013.01); *H01L 21/823807* (2013.01); *H01L 21/823814* (2013.01);
(Continued)

(58) Field of Classification Search
CPC ......... H01L 27/0922; H01L 21/823814; H01L 29/78618; H01L 21/823807;
(Continued)

(56) References Cited

U.S. PATENT DOCUMENTS

2015/0054043 A1    2/2015   Tan et al.

FOREIGN PATENT DOCUMENTS

| CN | 1828850 A | 9/2006 | |
| CN | 102881657 A * | 1/2013 | ......... H01L 27/1288 |

(Continued)

OTHER PUBLICATIONS

PCT International Search Report, Application No. PCT/CN2019/076871, dated Nov. 5, 2019, 6 pages: with English translation.
(Continued)

*Primary Examiner* — Edward Chin
(74) *Attorney, Agent, or Firm* — Armstrong Teasdale LLP

(57) ABSTRACT

The disclosure relates to a CMOS structure and a manufacturing method thereof. The CMOS structure includes a substrate and an N-type TFT and a P-type TFT on the substrate. The N-type TFT includes a first gate electrode, a first active layer, and a first gate dielectric layer therebetween. The first active layer includes a first semiconductor layer, a second semiconductor layer of the N-type, and a third semiconductor layer of the N-type which are located at opposite ends of the first semiconductor layer and sequentially stacked in a direction away from the first gate dielectric layer. An N-type doping concentration of the second semiconductor layer is smaller than that of the third semiconductor layer. The P-type TFT includes a fifth semiconductor layer and a sixth semiconductor layer. A P-type doping concentration of the fifth semiconductor layer is smaller than that of the sixth semiconductor layer.

9 Claims, 4 Drawing Sheets

(51) Int. Cl.
*H01L 29/66* (2006.01)
*H01L 29/786* (2006.01)

(52) U.S. Cl.
CPC .... *H01L 29/6675* (2013.01); *H01L 29/78618* (2013.01); *H01L 29/78663* (2013.01); *H01L 29/78672* (2013.01); *H01L 29/78696* (2013.01)

(58) Field of Classification Search
CPC ......... H01L 29/78696; H01L 29/78663; H01L 29/6675; H01L 29/78672
See application file for complete search history.

(56) References Cited

FOREIGN PATENT DOCUMENTS

| | | | | | |
|---|---|---|---|---|---|
| CN | 102881657 | A | | 1/2013 | |
| CN | 106847837 | A | * | 6/2017 | ......... H01L 27/1229 |
| CN | 106847837 | A | | 6/2017 | |
| CN | 108947889 | A | * | 12/2018 | |

OTHER PUBLICATIONS

PCT Written Opinion, Application No. PCT/CN2019/076871, dated Nov. 5, 2019, 7 pages.: with English translation of relevant part.

* cited by examiner

CMOS STRUCTURE AND METHOD FOR MANUFACTURING CMOS STRUCTURE

CROSS REFERENCE TO RELATED APPLICATIONS

This patent application is a National Stage Entry of PCT/CN2019/076871 filed on Mar. 4, 2019, the disclosure of which is incorporated by reference herein in its entirety as part of the present application.

BACKGROUND

The disclosure relates to the field of display technology. More specifically, it relates to a CMOS structure and a method for manufacturing a CMOS structure.

With the combination and upgrade of display technology and sensing technology, new devices have increasingly higher requirements for TFTs (Thin Film Transistors). TFTs are required to not only have the function of simple switching, but also have logic calculation and processing functions. This requires the TFT to form a CMOS (Complementary Metal Oxide Semiconductor) structure. However, currently, LTPS (Low Temperature Poly-silicon) can be used to manufacture the CMOS structure with TFT, but the process is complicated and the cost is high.

BRIEF DESCRIPTION

Embodiments of the present disclosure provide a CMOS structure and a method for manufacturing a CMOS structure.

Embodiments of the present disclosure provide a CMOS structure. The CMOS structure includes a substrate and an N-type TFT and a P-type TFT on the substrate. The N-type TFT includes a first gate electrode, a first active layer, and a first gate dielectric layer located between the first gate electrode and the first active layer. The first active layer includes a first semiconductor layer, a N-type second semiconductor layer of the N-type, and a third semiconductor layer of the N-type which are located at opposite ends of the first semiconductor layer and sequentially stacked in a direction away from the first gate dielectric layer. Wherein, an N-type doping concentration of the second semiconductor layer is smaller than an N-type doping concentration of the third semiconductor layer. The P-type TFT includes a second gate electrode, a second active layer, and a second gate dielectric layer located between the second gate electrode and the second active layer, wherein the second active layer includes a fourth semiconductor layer, and a fifth semiconductor layer of the P-type and a sixth semiconductor layer of the P-type which are at the opposite ends of the fourth semiconductor layer and sequentially stacked in a direction away from the second gate dielectric layer. Wherein, a P-type doping concentration of the fifth semiconductor layer is smaller than a P-type doping concentration of the sixth semiconductor layer.

In some embodiments, at least a portion of the first semiconductor layer serving as a channel region and a portion of the fourth semiconductor layer serving as a channel region include a polycrystalline semiconductor material.

In some embodiments, the source/drain regions of the first semiconductor layer and the source/drain regions of the fourth semiconductor layer include an amorphous semiconductor material.

In some embodiments, the second semiconductor layer, the third semiconductor layer, the fifth semiconductor layer, and the sixth semiconductor layer include the polycrystalline semiconductor material.

In some embodiments, the polycrystalline semiconductor material includes polysilicon, and the amorphous semiconductor material includes amorphous silicon.

In some embodiments, the N-type TFT further includes a first etch stop layer on a side, away from the first gate dielectric layer, of a portion of the first semiconductor layer serving as a channel region portion. An end portion of the first etch stop layer is located between the first semiconductor layer and the second semiconductor layer. The P-type TFT further includes a second etch stop layer on a side, away from the second gate dielectric layer, of a portion of the fourth semiconductor layer serving as a channel region. An end of the second etch stop layer is located between the fourth semiconductor layer and the fifth semiconductor layer.

In some embodiments, the first gate electrode, the first gate dielectric layer, and the first semiconductor layer are sequentially stacked in a direction away from the substrate, and wherein the second gate electrode, the second gate dielectric layer and the second semiconductor layer are sequentially stacked in a direction away from the substrate.

In some embodiments, the first active layer has a first source/drain region adjacent to the P-type TFT and a second source/drain region away from the P-type TFT, the second active layer has a third source/drain region adjacent to the N-type TFT and a fourth source/drain region away from the P-type TFT. The CMOS structure further includes a first source/drain electrode disposed on the first source/drain region, the second source/drain electrode disposed on the second source/drain region, a third source/drain electrode disposed on the third source/drain region, a fourth source/drain electrode disposed on the fourth source/drain region, wherein the first source/drain electrode is connected to the third source/drain electrode.

Embodiments of the present disclosure further provide a method for manufacturing a CMOS structure.

The method for manufacturing a CMOS structure includes forming an N-type TFT and a P-type TFT on a substrate. Wherein, forming the N-type TFT includes forming a first gate electrode, a first active layer, and a first gate dielectric layer located between the first gate electrode and the first active layer. The first active layer includes a first semiconductor layer, an N-type second semiconductor layer and an N-type third semiconductor layer which are at the opposite ends of the first semiconductor layer and sequentially stacked in a direction away from the first gate dielectric layer. Wherein, an N-type doping concentration of the second semiconductor layer is smaller than an N-type doping concentration of the third semiconductor layer. Forming the P-type TFT includes forming a second gate electrode, a second active layer, and a second gate dielectric layer located between the second gate electrode and the second active layer, wherein the second active layer includes a fourth semiconductor layer, a fifth semiconductor layer of the P-type and a sixth semiconductor layer of the P-type which are at the opposite ends of the fourth semiconductor layer and sequentially stacked in a direction away from the second gate dielectric layer. Wherein, a P-type doping concentration of the fifth semiconductor layer is smaller than a P-type doping concentration of the sixth semiconductor layer.

In some embodiments, at least a channel region of the first semiconductor layer and a channel region of the fourth semiconductor layer include a polycrystalline semiconductor material, a source/drain region of the first semiconductor layer, and a source/drain region of the fourth semiconductor layer include an amorphous semiconductor material.

In some embodiments, forming the first gate dielectric layer and the second gate dielectric layer includes forming a gate dielectric material layer on the first gate electrode and the second gate electrode, wherein a portion of the gate material dielectric layer on the first gate electrode constitutes the first gate dielectric layer, and wherein a portion of the gate material dielectric layer on the second gate electrode constitutes the second gate dielectric layer.

In some embodiments, forming the first semiconductor layer and the second semiconductor layer includes forming a first amorphous semiconductor material on the gate dielectric material layer, converting portions of the first amorphous semiconductor material layer on the first gate electrode and the second gate electrode into a polycrystalline semiconductor material to form a channel region of the first active layer and a channel region of the second active layer.

In some embodiments, the converting includes performing a laser annealing on the amorphous semiconductor material.

In some embodiments, performing the laser annealing includes using a microlens array mask.

In some embodiments, the method for manufacturing a CMOS structure further includes forming a first etch stop layer on a portion of the first semiconductor layer serving as a channel region, and forming a second etch stop layer on a portion of the fourth semiconductor layer serving as a channel region.

In some embodiments, forming the second semiconductor layer and the third semiconductor layer includes forming a second amorphous semiconductor material layer on the first semiconductor layer, forming a third amorphous semiconductor material layer on the second amorphous semiconductor material layer, and etching the second amorphous semiconductor material layer and the third amorphous semiconductor material layer located on the first etch stop layer to form a first gap extending to the first etch stop layer.

In some embodiments, forming the fifth semiconductor layer and the sixth semiconductor layer includes forming a fifth amorphous semiconductor material layer on the fourth semiconductor layer, forming a sixth amorphous semiconductor material layer on the fifth amorphous semiconductor material layer, and etching the fifth amorphous semiconductor material layer and the sixth amorphous semiconductor material layer located on the second etch stop layer to form a second gap extending to the second etch stop layer.

In some embodiments, forming the second amorphous semiconductor material layer, the third amorphous semiconductor material layer, the fifth amorphous semiconductor material layer, and the sixth amorphous semiconductor material layer includes using CVD.

In some embodiments, the first active layer has a first source/drain region adjacent to the P-type TFT and a second source/drain region away from the P-type TFT, and the second active layer has a third source/drain region adjacent to the N-type TFT and a fourth source/drain region away from the N-type TFT, the method further includes forming a conductive layer on the third semiconductor layer, the sixth semiconductor layer, the first gate dielectric layer, and the second gate dielectric layer, etching the conductive layer to form a first portion, a second portion, and a third portion spaced from one another, wherein the first portion covers the first source/drain region and the third source/drain region, the second portion covers the second source/drain region, and wherein the third portion covers the fourth source/drain region.

In some embodiments, the polycrystalline semiconductor material includes polysilicon, and the amorphous semiconductor material includes amorphous silicon.

BRIEF DESCRIPTION OF THE DRAWINGS

To describe the technical solutions in embodiments of the present disclosure more clearly, the accompanying drawings of embodiments are briefly described below. It should be understood that the drawings described below refer only to some embodiments of the present disclosure, and not to restrict the present disclosure, wherein.

DETAILED DESCRIPTION

Figure 1:
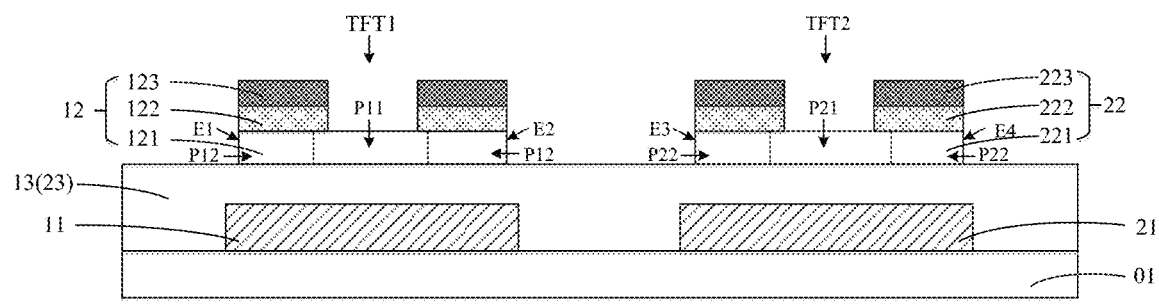
FIG. 1 is a schematic view of a CMOS structure according to an embodiment of the present disclosure.

In order to make the technical solutions and advantages of embodiments of the present disclosure more comprehensible, the technical solutions of embodiments of the present disclosure are clearly and completely described below with reference to the accompanying drawings. Obviously, the described embodiments are only a part but not all of embodiments of the present disclosure. Based on the described embodiments of the present disclosure, all other embodiments obtained by those skilled in the art without creative efforts shall also fall within the protection scope of the present disclosure.

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively.

For purposes of the description, hereinafter, the terms "upper", "lower", "right", "left", "vertical", "horizontal", "top", "bottom", and derivatives thereof shall relate to the disclosure, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "contact" means that a first element, such as a first structure, and a second element, such as a second structure, are connected with or without any intermediary elements at the interface of the two elements.

FIG. 1 is a schematic view of a CMOS structure according to an embodiment of the present disclosure. As shown in FIG. 1, a CMOS structure according to an embodiment of the present disclosure includes a substrate 01 and an N-type thin film transistor (N-type TFT) TFT1 and a P-type thin film transistor (P-type TFT) TFT2 on the substrate 01. As shown in FIG. 1, the N-type TFT includes a first gate electrode 11, a first active layer 12, and a first gate dielectric layer 13 located between the first gate electrode 11 and the first active layer 12. The first active layer 12 includes a first semiconductor layer 121, a second semiconductor layer 122 of the N-type, and a third semiconductor layer 123 of the N-type which are located at opposite ends (E1, E2) of the first semiconductor layer 121 and sequentially stacked in a direction away from the first gate dielectric layer 13. The N-type doping concentration of the second semiconductor layer 122 is less than the N-type doping concentration of the third semiconductor layer 123.

The P-type TFT includes a second gate electrode 21, a second active layer 22, and a second gate dielectric layer 23 located between the second gate electrode 21 and the second active layer 22. The second active layer 22 includes a fourth semiconductor layer 221, and a fifth semiconductor layer 222 of the P-type, and a sixth semiconductor layer 223 of the P-type which are at the opposite ends (E3, E4) of the fourth semiconductor layer 221 and sequentially stacked in a direction away from the second gate dielectric layer 23. The P-type doping concentration of the fifth semiconductor layer 222 is less than the P-type doping concentration of the sixth semiconductor layer 223.

As shown in FIG. 1, the second semiconductor layer 122 having a lower doping concentration isolates the third semiconductor layer 123 having a higher doping concentration from the first semiconductor layer 121, and the fifth semiconductor layer 222 having a lower doping concentration isolates the sixth semiconductor layer 223 with a higher doping concentration from the fourth semiconductor layer 221. Therefore, the lightly doped layers (the second semiconductor layer 122 and the fifth semiconductor layer 222) according to an embodiment of the present disclosure can isolate the heavily doped layers (the third semiconductor layer 123 and the sixth semiconductor layer 223) for ohmic contact from the channel region (a part of the first semiconductor layer 121). Therefore, embodiments of the present disclosure can reduce the hot carrier effect and reduce the leakage current.

In some embodiments, at least a portion P11 of the first semiconductor layer 121 as a channel region and a portion P21 of the fourth semiconductor layer 221 as a channel region may include a polycrystalline semiconductor material. In some embodiments, the source/drain regions P12 of the first semiconductor layer 121 and the source/drain regions P22 of the fourth semiconductor layer 221 may include an amorphous semiconductor material. In some embodiments, the second semiconductor layer 122, the third semiconductor layer 123, the fifth semiconductor layer 222, and the sixth semiconductor layer 223 may include a polycrystalline semiconductor material. For example, the polycrystalline semiconductor material may include polysilicon, and the amorphous semiconductor material may include amorphous silicon.

Figure 2:
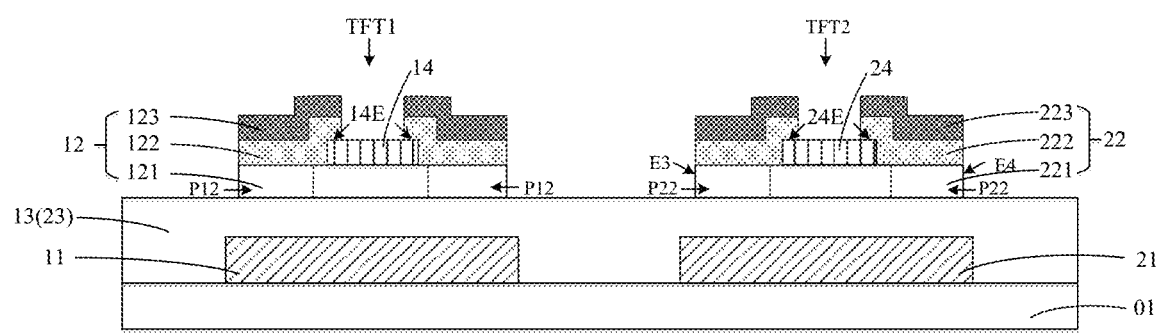
FIG. 2 is a schematic view of a CMOS structure according to an embodiment of the present disclosure.

FIG. 2 is a schematic view of a CMOS structure according to an embodiment of the present disclosure. As shown in FIG. 2, the N-type TFT (TFT1) further includes a first etch stop layer 14 on a side of a portion P11 of the first semiconductor layer 121 as a channel region portion that is away from the first gate dielectric layer 13. The 14E end portion of the first etch stop layer 14 is located between the first semiconductor layer 121 and the second semiconductor layer 122. The P-type TFT (TFT2) further includes a second etch stop layer 24 on a side of a portion P21 (see FIG. 1) of the fourth semiconductor layer 221 as a channel region away from the second gate dielectric layer 23. An end portion 24E of the second etch stop layer 24 is located between the fourth semiconductor layer 221 and the fifth semiconductor layer 222. By using the etch stop layer, the channel region of the TFT can be protected from being etched during the etching of the semiconductor layer.

According to some embodiments of the present disclosure, the thin film transistor may have a bottom gate structure, as shown in FIGS. 1 and 2. The first gate 11, the first gate dielectric layer 13, and the first semiconductor layer 121 may be sequentially stacked in a direction away from the substrate 01. The second gate 21, the second gate dielectric layer 23, and the second semiconductor layer 221 may be sequentially stacked in a direction away from the substrate 01. It should be understood that according to embodiments of the present disclosure, the thin film transistor may also be a top gate structure. In this case, the first semiconductor layer 121, the first gate dielectric layer 13, and the first gate electrode 11 may be sequentially stacked in a direction away from the substrate 01. The second semiconductor layer 221, the second gate dielectric layer 23, and the second gate 21 may be sequentially stacked in a direction away from the substrate 01.

Figure 3:
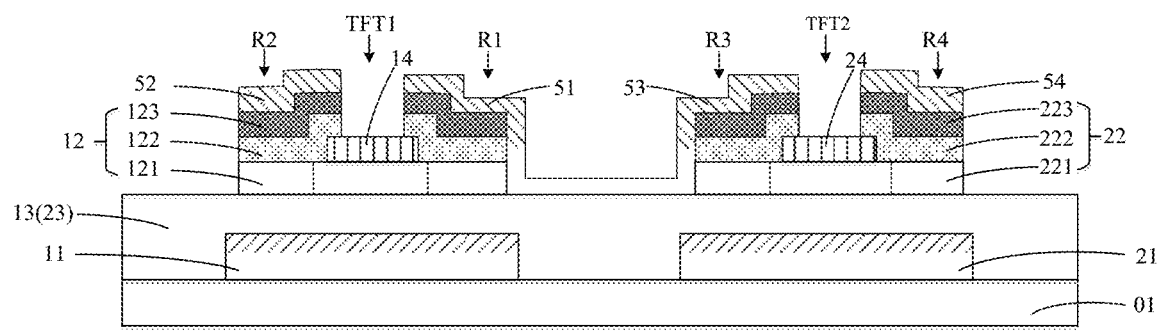
FIG. 3 is a schematic view of a CMOS structure according to an embodiment of the present disclosure.

FIG. 3 is a schematic view of a CMOS structure according to an embodiment of the present disclosure. As shown in FIG. 3, the first active layer 12 has a first source/drain region R1 adjacent to the P-type TFT (TFT2) and a second source/drain region R2 away from the P-type TFT (TFT2). The second active layer 22 has a third source/drain region R3 adjacent to the N-type TFT (TFT1) and a fourth source/drain region R4 away from the P-type TFT (TFT2). As shown in FIG. 3, the CMOS structure further includes a first source/drain electrode 51 disposed on the first source/drain region R1, a second source/drain electrode 52 disposed on the second source/drain region R2, a third source/drain electrode 53 provided on the third source/drain region R3, and a fourth source/drain electrode 54 provided on the fourth source/drain region R4. The first source/drain electrode 51 is connected to the third source/drain electrode 53.

The second semiconductor layer 122 may be an N-type lightly doped semiconductor layer. For example, the N-type doping concentration of the second semiconductor layer 122 may be between $10^{17}$ ions/cm$^3$ and $10^{19}$ ions/cm$^3$. The third semiconductor layer 123 may be an N-type heavily doped semiconductor layer. For example, the N-type doping concentration of the third semiconductor layer 123 may be between $10^{19}$ ions/cm$^3$ and $10^{21}$ ions/cm$^3$.

The fifth semiconductor layer 222 may be a P-type lightly doped semiconductor layer. For example, the doping concentration of the fifth semiconductor layer 222 may be between $10^{17}$ ions/cm$^3$ and $10^{19}$ ions/cm$^3$. The sixth semiconductor layer 223 may be a P-type heavily doped semiconductor layer. For example, the P-type doping concentration of the sixth semiconductor layer 223 may be between $10^{19}$ ions/cm$^3$ and $10^{21}$ ions/cm$^3$.

The N-type TFT (TFT1) and the P-type TFT (TFT2) are connected through the first source/drain electrode 51 and the third source/drain electrode 53 to avoid the undesired potential barrier brought by the direct contact between the third semiconductor layer 123 and the sixth semiconductor layer

223 to achieve the connection, conducive to improving the performance of the CMOS structure.

Some embodiments of the present disclosure also provide a method for manufacturing a CMOS structure. A method for manufacturing a CMOS structure according to some embodiments of the present disclosure includes forming an N-type TFT and a P-type TFT on a substrate.

In some embodiments of the present disclosure, forming the N-type TFT includes forming a first gate electrode 11, a first active layer 12, and a first gate dielectric layer 13 between the first gate electrode 11 and the first active layer 12. The first active layer 12 includes a first semiconductor layer 121, a second semiconductor layer 122 of the N-type, and a third semiconductor layer 123 of the N-type which are at the opposite ends (E1, E2) of the first semiconductor layer 121 and sequentially stacked in a direction away from the first gate dielectric layer 13. The N-type doping concentration of the second semiconductor layer 122 is smaller than the N-type doping concentration of the third semiconductor layer 123.

In some embodiments of the present disclosure, forming a P-type TFT includes forming a second gate electrode 21, a second active layer 22, and a second gate dielectric layer 23 between the second gate electrode 21 and the second active layer 22. Wherein, the second active layer 22 includes a fourth semiconductor layer 221, a fifth semiconductor layer 222 of the P-type, and a sixth semiconductor layer 223 of the P-type which are at the opposite ends (E3, E4) of the fourth semiconductor layer 221 and sequentially stacked in a direction away from the second gate dielectric layer 23. The P-type doping concentration of the fifth semiconductor layer 222 is smaller than the P-type doping concentration of the sixth semiconductor layer 223.

In an embodiment of the present disclosure, the channel region P11 of the first semiconductor layer and the channel region P12 of the fourth semiconductor layer may include a polycrystalline semiconductor material, and a source/drain region P12 of the first semiconductor layer, and a source/drain region P22 of the fourth semiconductor layer may include an amorphous semiconductor material. The polycrystalline semiconductor material may include polysilicon, and the amorphous semiconductor material may include amorphous silicon.

Figure 4:
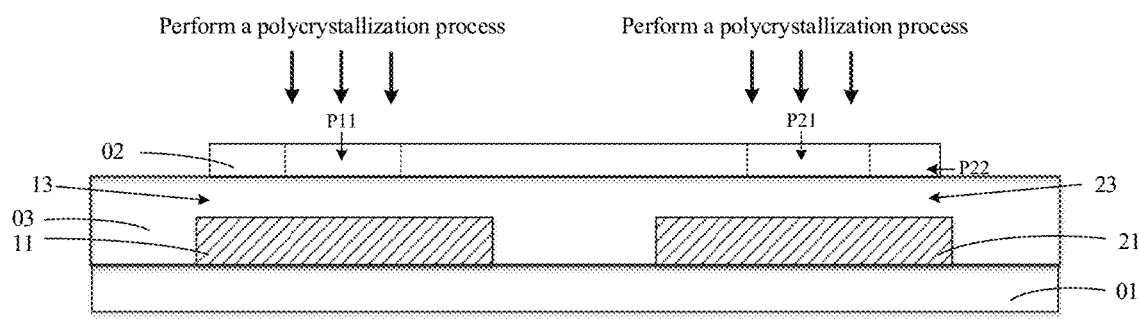
FIG. 4 is a schematic view of a method for manufacturing a CMOS structure according to an embodiment of the present disclosure.

FIG. 4 is a schematic view of a method for manufacturing a CMOS structure according to an embodiment of the present disclosure. As shown in FIG. 4, in an embodiment of the present disclosure, forming the first gate dielectric layer 13 and the second gate dielectric layer 23 includes forming a gate dielectric material layer 03 on the first gate electrode 11 and the second gate electrode 21. Wherein, a portion of the gate material dielectric layer 03 on the first gate electrode 11 constitutes the first gate dielectric layer 13, and a portion of the gate material dielectric layer 03 on the second gate electrode 21 constitutes the second gate dielectric layer 23.

In some embodiments of the present disclosure, forming the first semiconductor layer and the second semiconductor layer includes forming a first amorphous semiconductor material layer 02 on the gate dielectric material layer 03, converting portions of the first amorphous semiconductor material layer 02 on the first gate electrode 11 and the second gate electrode 21 into a polycrystalline semiconductor material to form a channel region P11 of the first active layer 12 and a channel region P21 of the second active layer 22.

The thickness of the first amorphous semiconductor material layer 02 may be 500 angstroms. Laser annealing can be used to convert the amorphous semiconductor material into a polycrystalline semiconductor material (i.e., perform a polycrystallization process). For example, a Micro Lens Array (MLA) mask can be used for laser annealing. MLA annealing has the advantage of high position accuracy.

In some embodiments of the present disclosure, the method for manufacturing a CMOS structure may further include forming a first etch stop layer 14 on a portion P11 of the first semiconductor layer that serves as a channel region, and forming a second etch stop layer 24 on a portion of the fourth semiconductor layer that serves as a channel region P21.

In some embodiments, an etch stop material layer may be deposited on the first amorphous semiconductor material layer 02 that has undergone the polycrystallization process. Then, the etch stop material layer is etched to form a first etch stop layer 14 and a second etch stop layer 24.

Figure 5A:
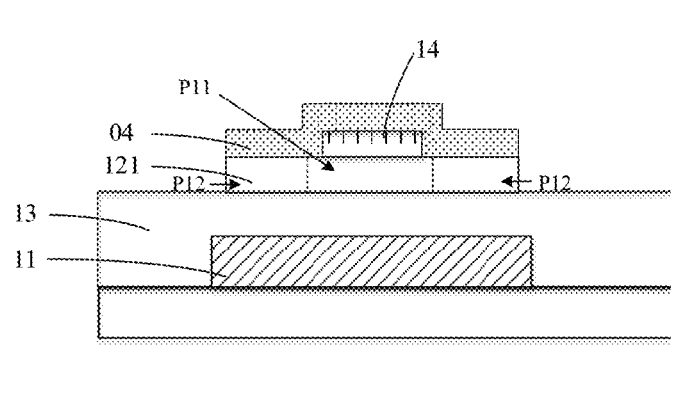
FIGS. 5A-5C are schematic views of a method of forming a second semiconductor layer and a third semiconductor layer of a method for manufacturing a CMOS structure according to an embodiment of the present disclosure.
Figure 5B:
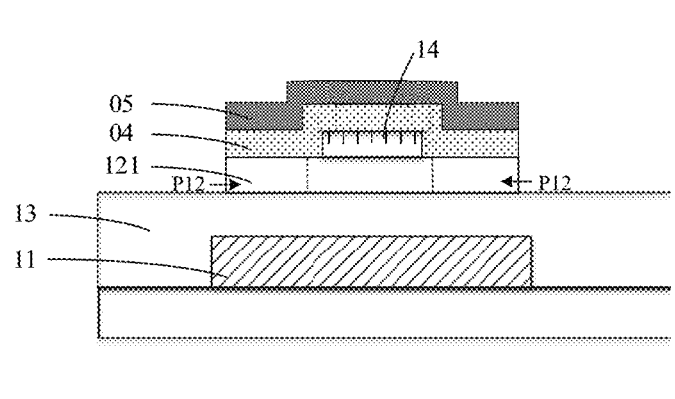
Figure 5C:
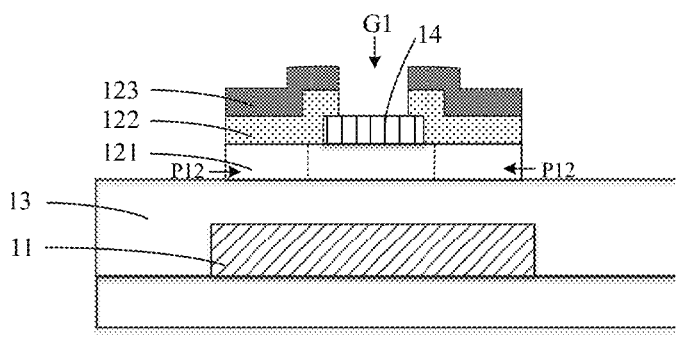

FIGS. 5A-5C are schematic views of a method of forming a second semiconductor layer and a third semiconductor layer in a method for manufacturing a CMOS structure according to an embodiment of the present disclosure. As shown in FIGS. 5A-5C, in an embodiment of the present disclosure, forming the second semiconductor layer and the third semiconductor layer includes:

S51. Forming a second amorphous semiconductor material layer 04 on the first semiconductor layer 121. For example, a lightly doped N-type amorphous silicon with a thickness of 500 angstroms can be deposited on the first semiconductor layer. The N-type semiconductor layer may be doped with a pentavalent impurity element of phosphorus.

S52. Forming a third amorphous semiconductor material layer 05 on the second amorphous semiconductor material layer 122. For example, a heavily doped N-type amorphous silicon semiconductor layer with a thickness of 500 angstroms may be deposited on the second amorphous semiconductor material layer.

S53. Etching the second amorphous semiconductor material layer 04 and the third amorphous semiconductor material layer 05 located on the first etch stop layer 14 to form a first gap G1 extending to the first etch stop layer 14.

Figure 6A:
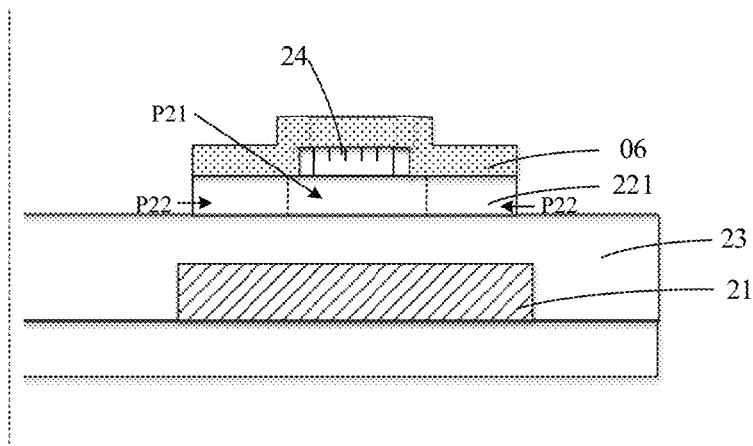
FIGS. 6A-6C are schematic views of a method of forming a fifth semiconductor layer and a sixth semiconductor layer in a method for manufacturing a CMOS structure according to an embodiment of the present disclosure.
Figure 6B:
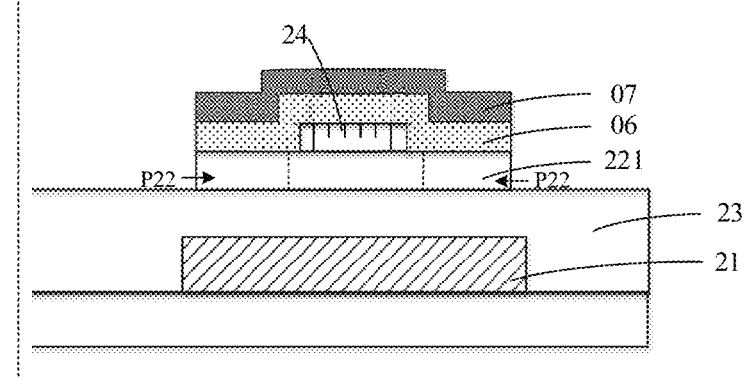
Figure 6C:
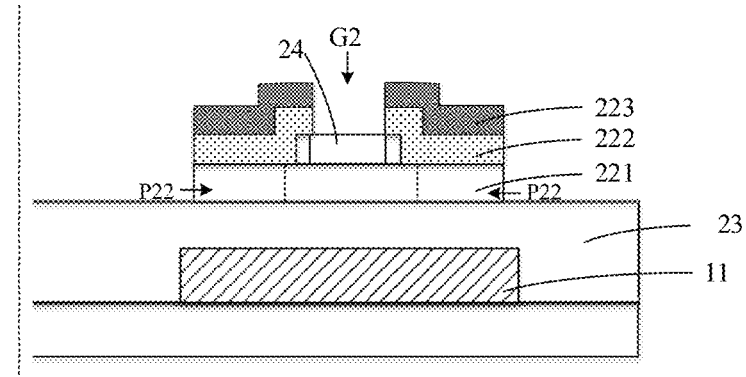

FIGS. 6A-6C are schematic views of a method of forming a fifth semiconductor layer and a sixth semiconductor layer in a method for manufacturing a CMOS structure according to an embodiment of the present disclosure. As shown in FIGS. 6A-6C, in an embodiment of the present disclosure, forming a fifth semiconductor layer and the sixth semiconductor layer includes:

S61. Forming a fifth amorphous semiconductor material layer 06 on the fourth semiconductor layer 221. For example, a lightly doped P-type amorphous silicon with a thickness of 500 angstroms may be deposited on the fourth semiconductor layer. The P-type semiconductor layer may be doped with a trivalent impurity element such as boron.

S62. Forming a sixth amorphous semiconductor material layer 07 on the fifth amorphous semiconductor material layer 06. For example, a heavily doped P-type amorphous silicon with a thickness of 500 angstroms may be deposited on the fifth amorphous semiconductor material layer 06.

S63. Etching the fifth amorphous semiconductor material layer 06 and the sixth amorphous semiconductor material layer 07 located on the second etch stop layer 24 to form a second gap G2 extending to the second etch stop layer 24.

In some embodiments of the present disclosure, forming the second amorphous semiconductor material layer, the third amorphous semiconductor material layer, the fifth amorphous semiconductor material layer, and the sixth amorphous semiconductor material layer includes using chemical vapor deposition (CVD).

Figure 7A:
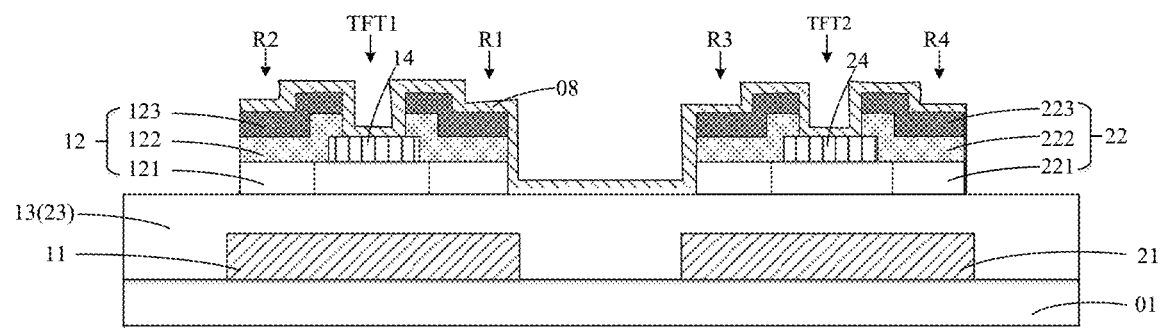
FIGS. 7A-7B are schematic views of a method for manufacturing a CMOS structure according to an embodiment of the present disclosure.
Figure 7B:
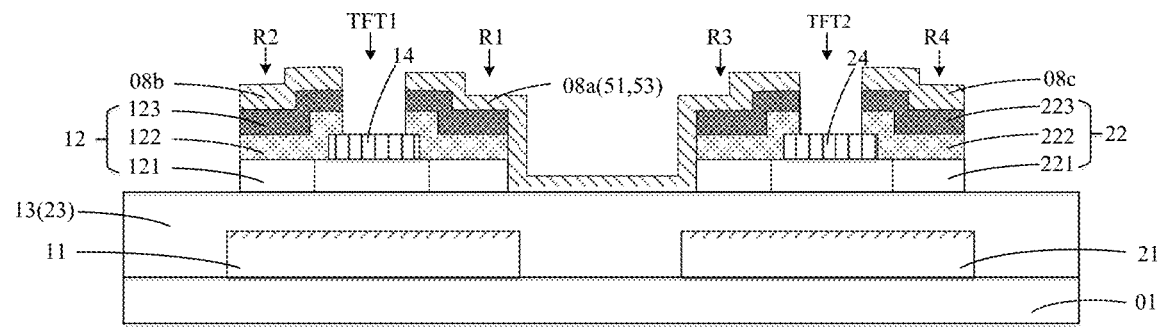

FIGS. 7A-7B are schematic views of a method for manufacturing a CMOS structure according to an embodiment of the present disclosure. As shown in FIGS. 7A-7B, the first active layer 12 has a first source/drain region R1 adjacent to the P-type TFT (TFT2) and a second source/drain region R2 away from the P-type TFT (TFT2). The second active layer 22 has a third source/drain region R3 adjacent to the N-type TFT (TFT1) and a fourth source/drain region R4 away from the N-type TFT (TFT2). The method for manufacturing a CMOS structure according to an embodiment of the present disclosure may further include:

S71. Forming a conductive layer 08 on the third semiconductor layer 123, the sixth semiconductor layer 223, the first gate dielectric layer 13, and the second gate dielectric layer 23.

S73. Etching the conductive layer to form a first portion 08a (51, 53), a second portion 08b (52), and a third portion 08c (54) spaced from one another. As shown in FIG. 7B, the first portion 08a covers the first source/drain region R1 and the third source/drain region R3, and the second portion 08b covers the second source/drain region R2, and the third portion 08c covers the fourth source/drain region R4.

The specific embodiments have been described, and are not intended to limit the scope of the disclosure. In fact, the novel embodiments described herein can be implemented in a variety of other forms. In addition, various omissions, substitutions, and changes in the form of embodiments described herein may be made without departing from the spirit of the disclosure. The following claims and their equivalents are intended to cover such forms or modifications that fall within the scope and spirit of the disclosure.

What is claimed is:

1. A method for manufacturing a CMOS structure, the method comprising:
    forming an N-type TFT and a P-type TFT on a substrate, wherein forming the N-type TFT comprises:
        forming a first gate electrode, a first active layer, and a first gate dielectric layer located between the first gate electrode and the first active layer, wherein the first active layer comprises a first semiconductor layer, a second semiconductor layer of the N-Type, and a third semiconductor layer of the N-type which are at opposite ends of the first semiconductor layer and sequentially stacked in a direction away from the first gate dielectric layer, wherein an N-type doping concentration of the second semiconductor layer is smaller than an N-type doping concentration of the third semiconductor layer, and
    wherein forming the P-type TFT comprises:
        forming a second gate electrode, a second active layer, and a second gate dielectric layer located between the second gate electrode and the second active layer, wherein the second active layer comprises a fourth semiconductor layer, a fifth semiconductor layer of the P-type, and a sixth semiconductor layer of the P-type which are at opposite ends of the fourth semiconductor layer and sequentially stacked in a direction away from the second gate dielectric layer, and wherein a P-type doping concentration of the fifth semiconductor layer is smaller than a P-type doping concentration of the sixth semiconductor layer,
    the method further comprising:
        forming a first etch stop layer on a portion of the first semiconductor layer serving as a channel region; and
        forming a second etch stop layer on a portion of the fourth semiconductor layer serving as a channel region,
    wherein forming the second semiconductor layer and the third semiconductor layer comprises:
        forming a second amorphous semiconductor material layer on the first semiconductor layer;
        forming a third amorphous semiconductor material layer on the second amorphous semiconductor material layer; and
        etching the second amorphous semiconductor material layer and the third amorphous semiconductor material layer located on the first etch stop layer to form a first gap extending to the first etch stop layer,
    wherein the first active layer has a first source/drain region adjacent to the P-type TFT and a second source/drain region away from the P-type TFT, and wherein the second active layer has a third source/drain region adjacent to the N-type TFT and a fourth source/drain region away from the N-type TFT, the method further comprising:
        forming a conductive layer on the third semiconductor layer, the sixth semiconductor layer, the first gate dielectric layer, and the second gate dielectric layer; and
        etching the conductive layer to form a first portion, a second portion, and a third portion spaced from one another, wherein the first portion covers the first source/drain region and the third source/drain region, wherein the second portion covers the second source/drain region, and wherein the third portion covers the fourth source/drain region.

2. The method for manufacturing a CMOS structure according to claim 1, wherein at least the channel region of the first semiconductor layer and the channel region of the fourth semiconductor layer comprise a polycrystalline semiconductor material, and wherein source/drain regions of the first semiconductor layer and source/drain regions of the fourth semiconductor layer comprise an amorphous semiconductor material.

3. The method for manufacturing a CMOS structure according to claim 2, wherein forming the first gate dielectric layer and the second gate dielectric layer comprises forming a gate dielectric material layer on the first gate electrode and the second gate electrode, wherein a portion of the gate material dielectric layer on the first gate electrode constitutes the first gate dielectric layer, and wherein a portion of the gate material dielectric layer on the second gate electrode constitutes the second gate dielectric layer.

4. The method for manufacturing a CMOS structure according to claim 3, wherein forming the first semiconductor layer and the second semiconductor layer comprises:
    forming a first amorphous semiconductor material layer on the gate dielectric material layer; and
    converting portions of the first amorphous semiconductor material layer on the first gate electrode and the second gate electrode into a polycrystalline semiconductor material to form a channel region of the first active layer and a channel region of the second active layer.

5. The method for manufacturing a CMOS structure according to claim 4, wherein the converting comprises performing laser annealing on the amorphous semiconductor material.

6. The method for manufacturing a CMOS structure according to claim 5, wherein the laser annealing comprises using a microlens array mask.

7. The method for manufacturing a CMOS structure according to claim 1, wherein forming the fifth semiconductor layer and the sixth semiconductor layer comprises:

forming a fifth amorphous semiconductor material layer on the fourth semiconductor layer;

forming a sixth amorphous semiconductor material layer on the fifth amorphous semiconductor material layer; and etching the fifth amorphous semiconductor material layer and the sixth amorphous semiconductor material layer located on the second etch stop layer to form a second gap extending to the second etch stop layer.

8. The method for manufacturing a CMOS structure according to claim 7, wherein forming the second amorphous semiconductor material layer, the third amorphous semiconductor material layer, the fifth amorphous semiconductor material layer, and the sixth amorphous semiconductor material layer comprises using CVD.

9. The method for manufacturing a CMOS structure according to claim 8, wherein the polycrystalline semiconductor material comprises polysilicon, and wherein the amorphous semiconductor material layers comprise amorphous silicon.

\* \* \* \* \*